(12) United States Patent
Lacarra

(10) Patent No.: US 9,004,432 B2
(45) Date of Patent: Apr. 14, 2015

(54) ROTATABLE HOUSING ASSEMBLY

(75) Inventor: David Laniado Lacarra, Mexicali B.C. (MX)

(73) Assignee: Accuride International Inc., Santa Fe Springs, CA (US)

( * ) Notice: Subject to any disclaimer, the term of this patent is extended or adjusted under 35 U.S.C. 154(b) by 540 days.

(21) Appl. No.: 13/191,287

(22) Filed: Jul. 26, 2011

(65) Prior Publication Data

US 2012/0018605 A1  Jan. 26, 2012

Related U.S. Application Data

(60) Provisional application No. 61/367,818, filed on Jul. 26, 2010.

(51) Int. Cl.
| | | |
|---|---|---|
| *A47F 5/00* | (2006.01) | |
| *A47H 1/10* | (2006.01) | |
| *H05K 7/14* | (2006.01) | |
| *A47B 88/04* | (2006.01) | |

(52) U.S. Cl.
CPC ............ *H05K 7/1489* (2013.01); *A47B 88/044* (2013.01)

(58) Field of Classification Search
USPC ......... 248/298.1, 235, 241, 247, 250, 225.21, 248/221.11, 222.11, 222.52, 200.1, 243; 211/26, 192, 187; 312/328, 334.4, 351, 312/408; 108/147.11, 106–108
See application file for complete search history.

(56) References Cited

U.S. PATENT DOCUMENTS

| | | | | |
|---|---|---|---|---|
| 2,616,643 A | * | 11/1952 | Budd ........................... | 248/27.1 |
| 4,784,046 A | * | 11/1988 | Gautier ........................... | 92/128 |
| 5,624,167 A | * | 4/1997 | Katz ........................... | 312/223.1 |
| 6,325,667 B2 | * | 12/2001 | Sawayanagi ................... | 439/537 |
| 6,554,142 B2 | * | 4/2003 | Gray ............................... | 211/26 |
| 7,289,318 B2 | * | 10/2007 | Hsiao ........................ | 361/679.41 |
| 7,473,846 B2 | * | 1/2009 | Doerr et al. ...................... | 174/69 |
| 7,909,296 B2 | * | 3/2011 | Moran-Grover et al. ......................... | 248/220.21 |
| 7,934,607 B2 | * | 5/2011 | Henderson et al. ............. | 211/26 |
| 8,235,339 B2 | * | 8/2012 | Selvidge et al. ......... | 248/220.21 |
| 8,276,867 B2 | * | 10/2012 | Hung ............................ | 248/323 |
| 8,379,410 B2 | * | 2/2013 | Kitten ........................... | 361/826 |
| 8,387,933 B2 | * | 3/2013 | Yu et al. ................... | 248/220.22 |
| 8,537,545 B2 | * | 9/2013 | Peng et al. ................ | 361/679.58 |
| 2003/0019824 A1 | * | 1/2003 | Gray ............................... | 211/26 |
| 2004/0079712 A1 | * | 4/2004 | Mayer .............................. | 211/26 |
| 2004/0084915 A1 | * | 5/2004 | Moffatt ........................ | 294/19.1 |

(Continued)

OTHER PUBLICATIONS

International Search Report on corresponding PCT application (PCT/US2011/045387) from International Searching Authority (KIPO) dated Mar. 27, 2012.

(Continued)

*Primary Examiner* — Nkeisha Smith
(74) *Attorney, Agent, or Firm* — Klein, O'Neill & Singh, LLP

(57) ABSTRACT

A rotatable housing assembly for use in mounting slides to equipment racks has components for different mounting options on different sides of the housing, and a retractable pin for use in positioning the housing. In some embodiments the housing is rotatably mounted to a bracket attached to a slide member, for example approximate a front of the side, and the retractable pin extends into a semicircular slot of the bracket for use in indexing position of the housing. The housing may include a button for use in retracting the retractable pin, and the assembly may provide for toolless mounting of the slide, and do so in a variety of rack configurations.

25 Claims, 10 Drawing Sheets

(56) References Cited

U.S. PATENT DOCUMENTS

| | | |
|---|---|---|
| 2004/0233643 A1 | 11/2004 | Bolich et al. |
| 2005/0052102 A1 | 3/2005 | Lauchner |
| 2008/0073469 A1* | 3/2008 | Mushan et al. ............ 248/205.1 |
| 2008/0230496 A1 | 9/2008 | Henderson et al. |
| 2008/0296455 A1* | 12/2008 | Brock et al. ............... 248/298.1 |
| 2009/0114785 A1* | 5/2009 | Huang et al. ............ 248/220.31 |
| 2009/0266960 A1* | 10/2009 | Moran-Grover et al. .. 248/298.1 |
| 2009/0316340 A1 | 12/2009 | Mitamura et al. |
| 2012/0292274 A1* | 11/2012 | Lin et al. .................... 211/86.01 |

OTHER PUBLICATIONS

Written Opinion on corresponding PCT application (PCT/US2011/045387) from International Searching Authority (KIPO) dated Mar. 27, 2012.

\* cited by examiner

ROTATABLE HOUSING ASSEMBLY

CROSS REFERENCE TO RELATED APPLICATIONS

This application claims the benefit of the filing date of U.S. Provisional Patent Application No. 61/367,818, filed Jul. 26, 2010, the disclosure of which is incorporated by reference.

BACKGROUND OF THE INVENTION

The present invention relates generally to slides, and more particularly to mounting apparatus for slides.

Slides are often used in extensibly mounting items for easy access. Slides are used to mount drawers within cabinetry, computer equipment within racks, and in a variety of other applications. At times nomenclature for slides follows their form, with for example telescopic slides having slide members nested within one another and extending in a telescopic fashion, over and under slides having one slide member over another slide member, and so on. At other times slides are identified by their mounting position with respect to the item they carry, such as a bottom mount slide which may be mounted underneath a drawer or side mount slides which may be mounted on opposite sides of a drawer. At other times nomenclature for slides follows their use, with for example slides coupling drawers within cabinets being called drawer slides and slides mounting computer equipment in a rack being termed rack mounted slides. However, the slides themselves often may be used in a variety of applications, although particular slides may have particular auxiliary features and/or associated hardware that recommend or are adapted for a particular use.

One use of auxiliary hardware is in mounting slides to an enclosure, such as a cabinet or a rack. For example, brackets may be coupled to a slide to allow for variations in depth of the enclosure, as well as to account for variations in mounting points. With regard to depth of enclosure, the brackets themselves are often themselves extensible with respect to the slide, at least before fixation of the bracket to the slide. Mounting points for enclosures, however, may vary in a seemingly bewildering fashion, even for enclosures of nominally the same type. In addition, the method of mounting may also vary, whether through the use of hooks, screws, posts, or other items.

For example, racks for computer equipment may present different mounting options. Although there is some standardization of computer racks, the racks may provide square holes for mounting, round holes for mounting, and different hole spacing. Moreover, different suppliers may provide, or different end users may have, different racks for similar computer equipment, or the end users may wish to move equipment from rack to rack. Accordingly, extensibly mounting of computer equipment in racks may require use of a variety of auxiliary hardware, with associated stocking and labor issues.

BRIEF SUMMARY OF THE INVENTION

Aspects of the invention provide a housing assembly for mounting slides to an enclosure. Some aspects of the invention provide a rotatable housing on a bracket for mounting slides to an enclosure. Some aspects of the invention provide a rotatable housing assembly on a bracket, with the housing assembly indexable to allow for different mounting configurations.

In some aspects the invention provides a slide assembly for use in rack mounted applications, comprising: a first slide member; a second slide member extendably coupled to the first slide member; and a housing rotatably coupled to the first slide member, the housing having protrusions extending from opposing side walls of the housing and a retractable pin extending from the housing and engageable with a feature associated with the first slide member.

In some aspects the invention provides a housing assembly for mounting a slide to a rack for computer equipment, comprising: a body, the body having an aperture for use in rotatably mounting the housing assembly; protrusions for a first mounting configuration extending from the body in a direction orthogonal to an axis of the aperture; protrusions for a second mounting configuration extending from the body in a direction other than a direction of extension of the protrusion for the first mounting configuration; and a retractable pin extending from the body in a direction parallel to the axis of the aperture.

In some aspects the invention provides a mounting assembly for mounting a slide to a rack for computer equipment, comprising: a bracket for coupling to a slide member; a housing assembly rotatably coupled to the bracket comprising: a body having a generally parallelepiped shape; an aperture extending between first and second surfaces of the body, the housing assembly rotatably mounted to the bracket at the aperture; protrusions for a first mounting configuration disposed on a third surface of the body; protrusions for a second mounting configuration disposed on a fourth surface of the body, the fourth surface opposite the third surface; and a retractable pin extending from the first surface toward the bracket.

These and other aspects of the invention are more fully comprehended on review of this disclosure.

DETAILED DESCRIPTION

Figure 1:
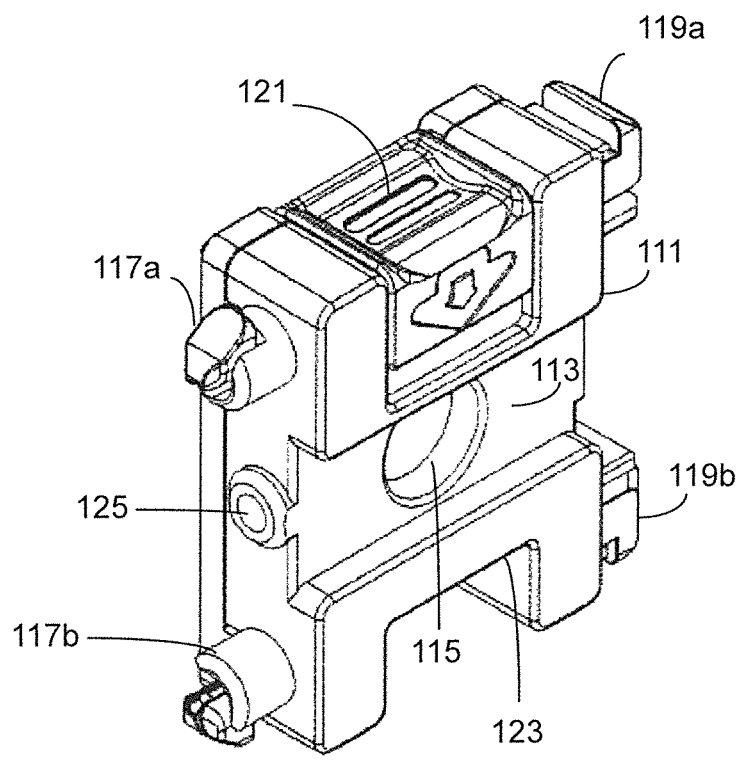
FIG. 1 is a perspective view of a housing assembly in accordance with aspects of the invention.

FIG. 1 is a perspective view of a housing assembly in accordance with aspects of the invention. The housing including a body 111. The body is roughly parallelepiped in outline, with the housing as shown having similar height and length with a comparatively reduced depth. The housing includes a rectangular cutout 113 across its length about a centerline of its height, with the cutout for convenience being considered to extend across a front of the housing from a first sidewall of the housing to an opposing sidewall of the housing. A central aperture 115 through its depth within the rectangular cutout and at a center of the housing, midway between the sidewalls. The central aperture is configured to receive a rivet or other fixing element to allow the housing to be loosely fixed (at least sufficient to allow rotation) to another piece, such as a bracket or a slide.

The housing assembly, again as illustrated in FIG. 1, includes first protrusions 117a and 117b and second protrusions 119a and 119b on opposing sidewalls. The protrusions are configured to mate with mounting points of, for example, a rack such as may be used for mounting computer equipment. Preferably, and as illustrated in FIG. 1, the first protrusions are cylindrical in form, and are configured for mating with round holes of the rack, while the second protrusions are parallelepiped in form, and are configured for mating with square holes of the rack.

A depressible button 121 is located in what may be considered, again for convenience, a top of the housing assembly. The button, as illustrated, is located in a top rectangular cutout of the body. The body includes a further cutout 123 located in what for convenience may be considered a bottom of the body, on an opposite side of the body from the top rectangular cutout. The further cutout may be advantageous in allowing a user operating the button to apply counter pressure to a bottom surface of the housing assembly, and this may be particularly advantageous when the housing assembly is sized to allow the button and the further cutout to be grasped using fingers of the same hand, for example as often is the case when the housing is sized to have a height approximating that of a slide member or of a web of a slide.

The housing assembly of FIG. 1 also includes a first further, smaller protrusion 125 midway between the first protrusions 117a and 117b. The first further, smaller protrusion is also of cylindrical form, and is also configured for mating with a round hole. The first further, smaller protrusion is useful for a variety of reasons, including providing a further visual indicator of the type of hole intended for the first protrusions. In addition, if the first further, smaller protrusion has a height approximate that expected of a rail making up the rack, the first further, smaller protrusion may also provide a visual indicator of proper mounting of the housing assembly to the rack. In some embodiments the first further, smaller protrusion includes a bore along its axis. with the bore threaded so as to receive a threaded bolt or screw, for example a thumb screw. In such an embodiment, a screw or bolt, with associated washers or other hardware in some embodiments, may be used to effectively further secure the housing in position when the housing assembly is mounted to the rack.

Figure 2:
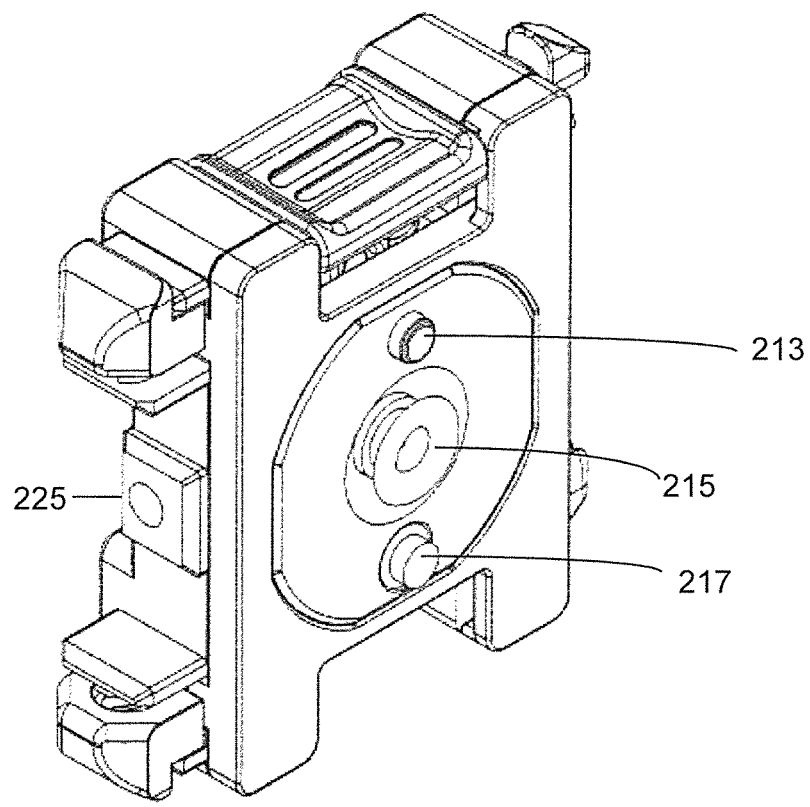
FIG. 2 illustrates a further view of the housing assembly of FIG. 1 in accordance with aspects of the invention.

FIG. 2 illustrates a further view of the housing assembly of FIG. 1, with a shoulder rivet 215 inserted in the central aperture. Using the terminology of FIG. 1, the view in FIG. 2 includes a rear of the housing assembly. Two pins extend from the body. A first pin 213 extends from the rear of the body of the housing assembly. As illustrated, the first pin extends from the rear of the body between the central aperture and the button, and the first pin is a retractable pin, retractable to a position within the body, or at least retractable towards the body. A second pin 217 also extends from the rear of the body. As illustrated, the second pin extends from the rear of the housing between the central aperture and the bottom of the housing, with the first pin and the second pin equidistant from the central aperture. The second pin may be integrally formed with the body, as in the example of FIG. 2, or may be separately formed and inserted, for example by way of press fitting, into a cavity of the body. In addition, in some embodiments the second pin may be retractable in the manner of the first pin.

As also may be seen in FIG. 2, a second further, smaller protrusion 225 is midway between the second protrusions 119a and 119b of FIG. 1 on the opposing sidewall hidden from view in FIG. 1. Like the second protrusions, the second further, smaller protrusion is of parallelepiped form, but, as with the first further, smaller protrusion, having a reduced height. In addition, as with the first further, smaller protrusion, the second further, smaller protrusion may be threaded to receive a threaded bolt or screw or the like.

Figure 3:
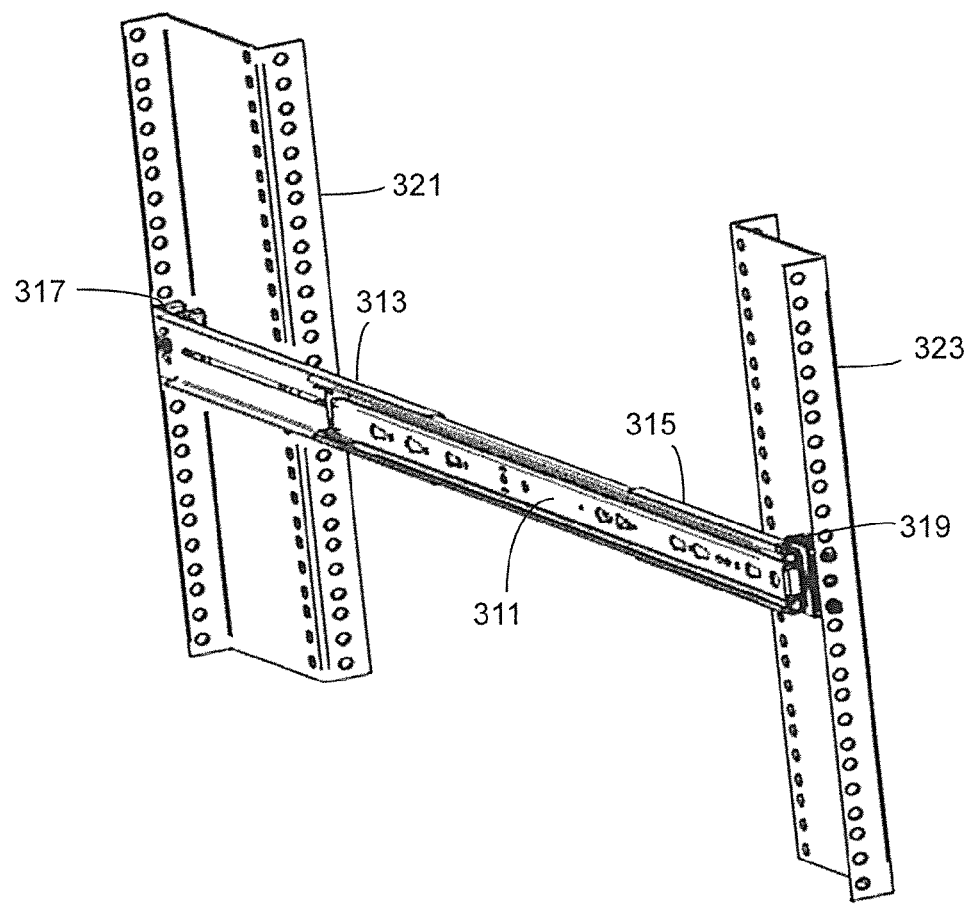
FIG. 3 illustrates a slide mounted to portions of a rack in accordance with aspects of the invention.

FIG. 3 illustrates a slide 311 mounted to portions of a rack in accordance with aspects of the invention, with for example the rack configured to hold computer equipment. As illustrated the slide is a telescopic slide, but in various embodiments other types of slides may be used. The slide includes one member, as shown an outer member, which will coupled to and remain stationary to the rack in operation, and at least one other member, for example an inner member coupled to and stationary with respect to equipment carried by the slide. The inner member is also extendably coupled to the outer member, allowing for extension of the equipment carried by the slide. The inner member may be in direct contact with the outer member, for example as in a friction slide, or be coupled to the outer member by way of roller or other bearings or the like. In addition, in many embodiments one or more additional members may be extendably interposed between the inner and outer members, for example to provide for increased slide extension, with generally only a single additional member, an intermediate member, being used.

Generally a rack will include four vertical posts connecting a floor and a roof (both of which may be open), the floor and the roof having the same dimension and having a square or rectangular footprint, and the vertical posts being at or about corners of the floor and roof. Also generally, two adjacent posts on a side of the rack define a front opening, and the opposing two posts define a rear of the rack. FIG. 3 illustrates a portion of the rack, showing a portion of a rear post 321 and an adjacent front post 323. Each of the front and rear posts include mounting holes vertically arranged to allow for mounting of items to the posts at a variety of vertical positions.

As illustrated in FIG. 3, the distance between the mounting holes of the front post and the mounting holes of the rear post is greater than an unextended length of the slide. Accordingly, extendable brackets are coupled to a member of the slide, with a rear bracket 313 coupled to a rear of the slide and a front bracket 315 coupled to a front of the slide. The brackets may also be used, however, if the distance between the front and rear mounting holes is less than the unextended length of the slide, in which case generally the slide will extend past the rear post and outside the rack.

A front rotatable housing assembly 319 couples the front bracket to the front post, and a rear rotatable housing assembly 317 couples the rear bracket to the rear post. Each of the rotatable housings is in some embodiments similar to or the same as the rotatable housing assembly of FIG. 1, or other rotatable housing assemblies discussed herein. In one embodiment the rotatable housing assembly includes mounting points on different or opposing sides of the rotatable housing, and a retractable indexing pin engageable with a feature of the bracket for proper angular positioning of the rotatable housing assembly. In some embodiments the pin is retractable through depression of a button into the housing, with in some embodiments the button configured to act as a cam against an eccentrically or sloped shaped portion provided in some embodiments for the pin.

Figure 4:
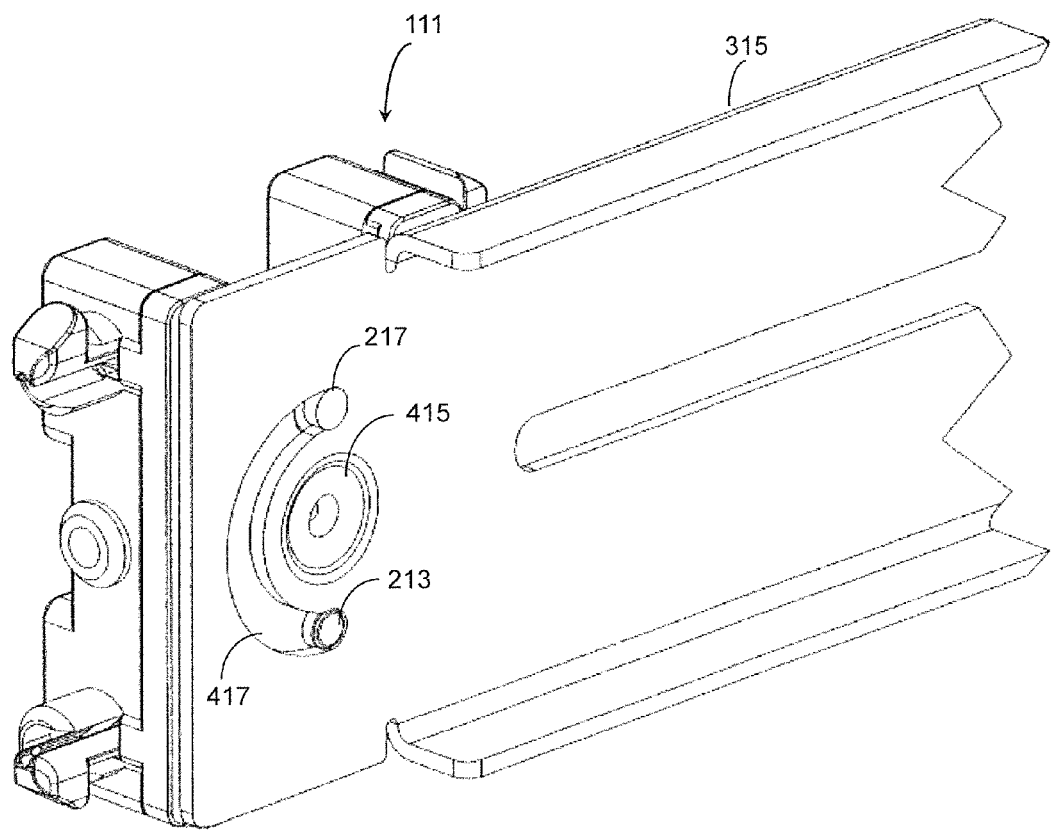
FIG. 4 illustrates a rotatable housing assembly mounted to a bracket in accordance with aspects of the invention.

FIG. 4 illustrates a rotatable housing assembly 111 mounted to a bracket 315 in accordance with aspects of the invention. The rotatable housing assembly may be the same as or similar to the rotatable housing assembly of FIG. 1, and the bracket may include a feature, such as a longitudinal slot, for use in extendably coupling the bracket to a slide member. In addition, the bracket may include longitudinal flanges about either side of a longitudinal web in order to provide stability with respect to the slide member and/or improved load transfer capability.

A rivet 415, or in various other embodiments some other fastener, rotatably couples the housing assembly about a longitudinal end of the bracket. In the embodiment of FIG. 4, the rivet passes through the web of the bracket and through or into a corresponding aperture or cavity of the body of the rotatable housing assembly. The housing assembly may therefore rotate with respect to the bracket about an axis defined by the rivet.

The bracket includes a slot 417. Two pins from the housing extend into the slot. A first pin 217 is fixed in position with respect to the body of the housing assembly. A second pin 213 is fixed in position with respect to the height and length of the body of the housing assembly, but is retractable with respect to the depth of the body, with the terms height, length, and depth for convenience being used in the same manner as with respect to FIG. 1.

As illustrated, the slot defines a semicircular portion of a ring, with a center of the ring being along the axis of the rivet. The pins as illustrated in FIG. 4 are located at opposing ends of the slot, with the first pin at a first end of the slot and the second pin at an opposing second end of the slot, with each pin thereby preventing angular motion of the rotatable housing in an opposing direction. Preferably, the pins have sufficient strength to be able to assist in or perform load transfer from the bracket to the housing, resulting in reduced diametrical loading on the rivet. In addition, conveniently, mounting protrusions of the rotatable housing are positioned for mounting to mounting points of a rack with the pins so arranged.

Figure 5:
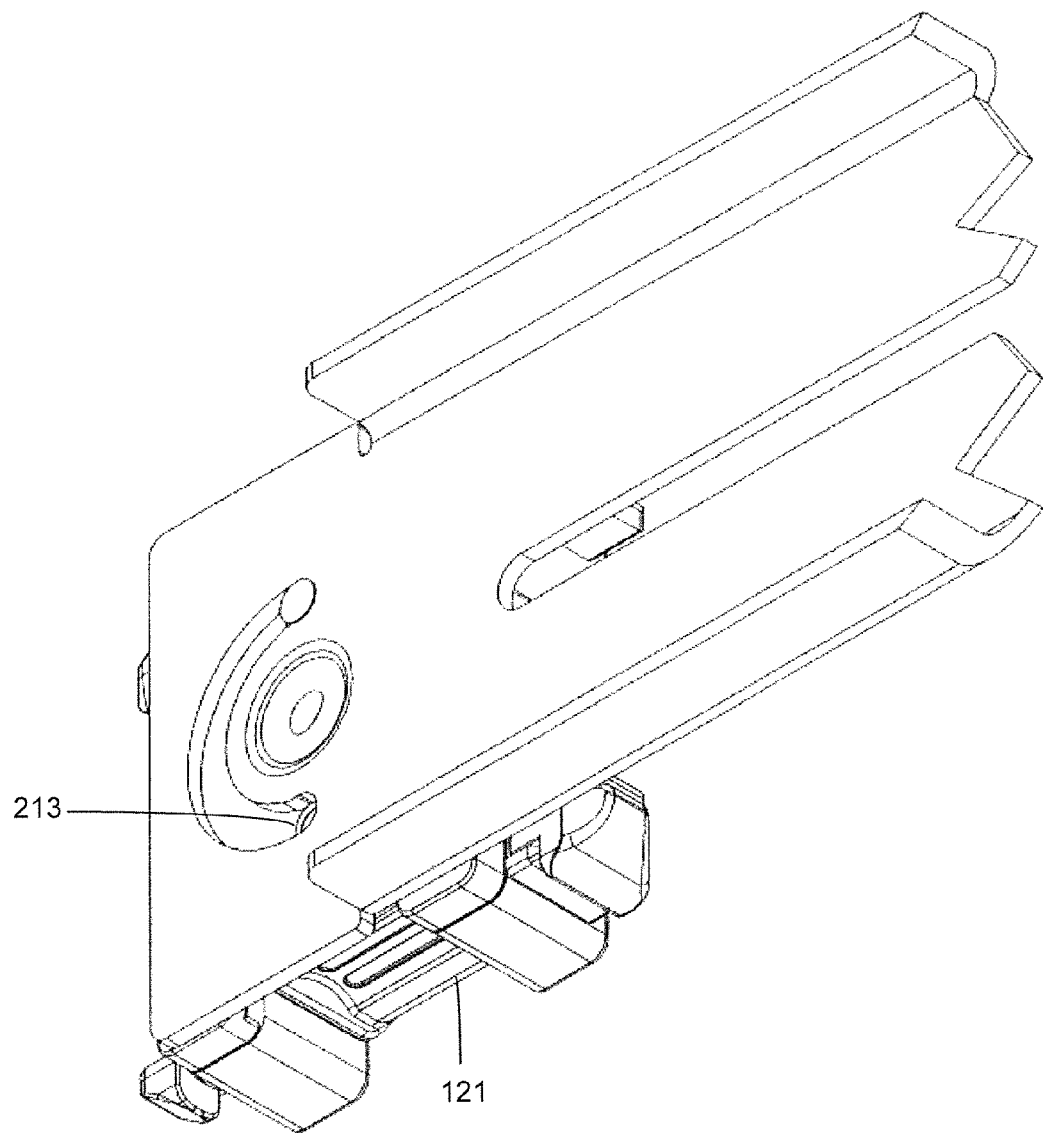
FIG. 5 illustrates a further view of the rotatable housing assembly mounted to the bracket of FIG. 4.

Upon retraction of the second pin, such that the second pin clears the bracket, the rotatable housing assembly may be rotated with the first pin moving within the slot. In some embodiments, as may be seen in FIG. 5, the second pin (shown as 213 in FIG. 5) may be retracted through depression of a button 121, with the button or some intermediate structure camming or otherwise forcing or allowing retraction of the second pin. Returning to FIG. 4, the housing may be rotated until the first pin reaches the second opposing end of the slot. In such a position, the second pin may reenter the slot, as in the embodiment of FIG. 4 axial centers of the pins are on opposing sides of the axis defined by the center of the rivet and the slot is sufficiently long, so as to form slightly over half of a ring, that both pins may be in the slot in reversed positions. In addition, in such a position, with the pins reversed in the slot as compared to as illustrated in FIG. 4, protrusions of an opposing sidewall are positioned for mounting to mounting points of the rack. Further, once the first pin reaches the end of the slot, an audible noise may result as the second pin reenters the slot, providing auditory confirmation to a user that the housing assembly has reached an appropriate position, in addition to visual confirmation that may be provided if equipment mounted to a slide member coupled to the bracket does not obstruct view of the pin. The auditory confirmation may be provided, for example, by a portion of the second pin contacting an interfering part preventing further extraction of the pin.

In various embodiments the slot may be replaced by apertures, with the apertures positioned at what would be end locations of the slot, with the first pin also made retractable. In addition, length of the slot may be varied, for example depending on geometry of position of the mounting points on the housing and/or positions of the pins, and a combination of slot and aperture may be used in some embodiments, and/or fewer or additional pins.

Figure 6:
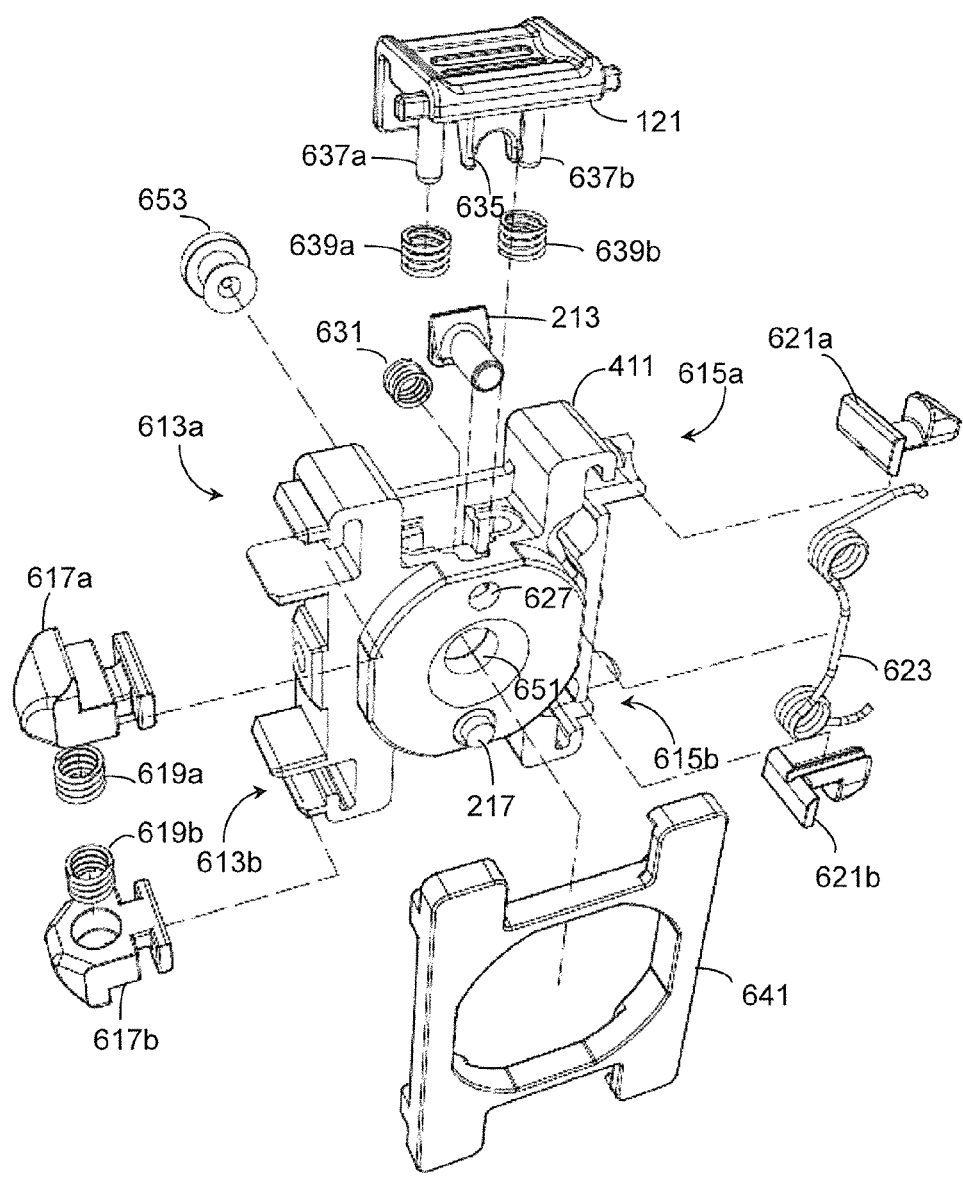
FIG. 6 illustrates an exploded view of a rotatable housing assembly in accordance with aspects of the invention.

FIG. 6 illustrates an exploded view of a rotatable housing assembly in accordance with aspects of the invention. The housing assembly includes a body 411. The housing is roughly parallelepiped in form, with upper and lower cutouts and attachment slot formations about corners of the body. An aperture 651 to receive a rivet, post, or other element passes through a central portion of the body.

The attachment slot formations include first attachment slot formations 613a,b about corners on one side of the body and second attachment slot formations 615a,b about corners on an opposing side of the body. The attachment slot formations include a slot opening to receive an attachment, with the slot opening terminating in a wall. The wall may serve, for example, to prevent the attachment from sliding through the slot and out of the body. With the attachments in the attachment slot formations, a cover 641 may be affixed to the body to prevent the attachments from sliding out of the slot opening. In various embodiments other structures may be used to allow for coupling of the attachments to the body, for example different slots may be used, cavities adapted to receive a pin or other element may be utilized, or the attachment slot formations may provide a male coupling for a female coupling of the attachment.

In the embodiment of FIG. 6, each of the first attachment slot formations includes a flat wall extending outward from the body. The flat wall is configured for insertion into a square mounting hole of a rack. In some embodiments the flat walls are of sufficient strength to support a rack mounted slide carrying equipment, and in some embodiments the flat walls extend from the body approximately the same distance, the same distance, or a greater distance than the attachments later discussed. Having the flat walls of sufficient strength to support the slide carrying equipment allows for increased ability to install and remove the housing assembly from a rack without damage or undue damage to the housing assembly. In this regard, in some embodiments the flat walls are separately formed from the housing, for example using a stronger material, and press fit or otherwise secured to the housing. As illustrated each of the flat walls are along a depth of the body. In various embodiments, however, the flat walls may be perpendicular to the depth of the body, or one of the flat walls may be along a depth of the body and the other of the flat walls may be perpendicular to the depth of the body.

The first attachment slots are configured to receive first attachments 617a,b. The first attachments include a forward barb, a body, and a rear plate coupled to the body by a standoff. The barb is configured for latching against a rack wall about a square mounting hole, and the rear plate is configured for insertion into a slot of the attachment slots. In addition, the first attachments include bores to receive springs 619a,b associated with the first attachments.

The springs are shown as compression springs, although in various other embodiments other springs may be used, with in some instances geometry of the first attachments and/or body being correspondingly modified. The springs each have one end in a bore of the corresponding first attachment and another end biasing against the corresponding flat wall of the first attachment slot formations. The springs, therefore, normally bias the first attachments outward from a centerline of the body bisecting its height. In some embodiments the first attachments may be pliable, with the springs resulting in bending of the first attachments. In most embodiments, however, the slots (and other portions) of the first attachment slot formations are sized so as to allow vertical displacement of the first attachments.

The second attachment slot formations and second attachments 621*a,b* are similar to the first attachment slot formations and the first attachments, respectively. In some embodiments these items are the same (or vice versa). In the embodiment of FIG. 6, the second attachment slot formations have a rounded wall in place of the flat wall of the first attachment slot formations, and the barbs and body of the second attachments are similarly rounded. The rounded walls and rounded portions of the second attachments are configured for insertion into, for example, rounded mounting holes of a rack. In addition, in some embodiments the rounded walls have a length, strength, and/or construction as discussed with respect to the flat walls.

The second attachments are, like the first attachments, normally vertically outwardly biased by a spring. For the second attachments, a torsion spring 623 is utilized, with the housing body including a cutout to receive portions of the spring and the second attachment including a slot to receive an arm of the spring.

The body includes a fixed pin 217 extending from a face of the body. The fixed pin may be integrally formed with the body, or separately formed and partially inserted into the body. Separately forming the fixed pin allows the fixed pin to be made of a different material than the body, which may be desirable, for example, to provide for different, generally increased, load bearing characteristics.

A moveable pin 213 is arranged symmetrically with the fixed pin. The moveable pin may be extended from or retracted into the body of the housing by way of a hole 627 into the face of the body, with the hole in the case of the embodiment of FIG. 6 leading into a cavity of the body. The moveable pin includes an angled terminating plate within the cavity, with the pin proper extending or into or through the hole. A spring 631 normally biases the pin such that the pin extends from the face of the body of the housing assembly.

A button 121 is depressible into the cavity, perpendicularly to an axis of the moveable pin. The button is normally biased away from the housing by springs. In the embodiment of FIG. 6, the button includes two posts 637*a,b* to receive compression springs 639*a,b*, which perform the biasing function, although the spring for the moveable pin, in conjunction with the angled terminating plate may also or instead perform this function in some embodiments.

The button includes a descending fork 635 to engage the moveable pin. In various embodiments the descending fork may have other forms, for example a descending plate or multiple descending arms, but a forklike structure is useful in maintaining position with respect to the moveable pin.

Figure 7A:
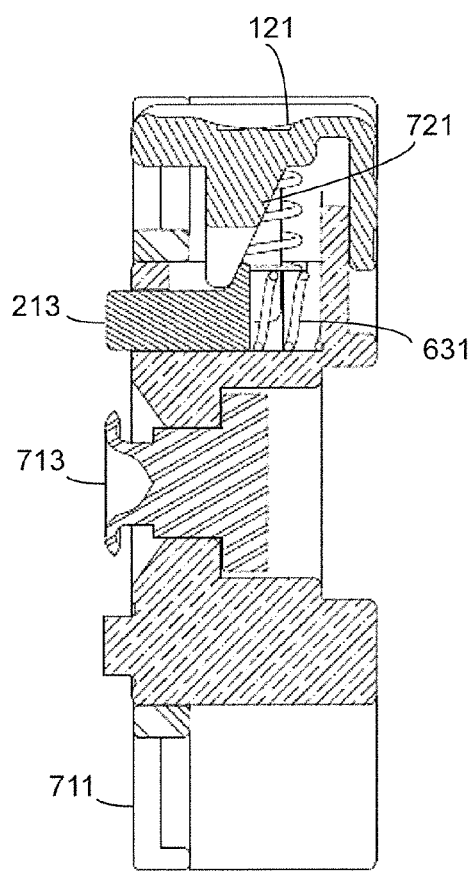
FIGS. 7A and 7B are cut away views of the housing assembly of FIG. 6
Figure 7B:
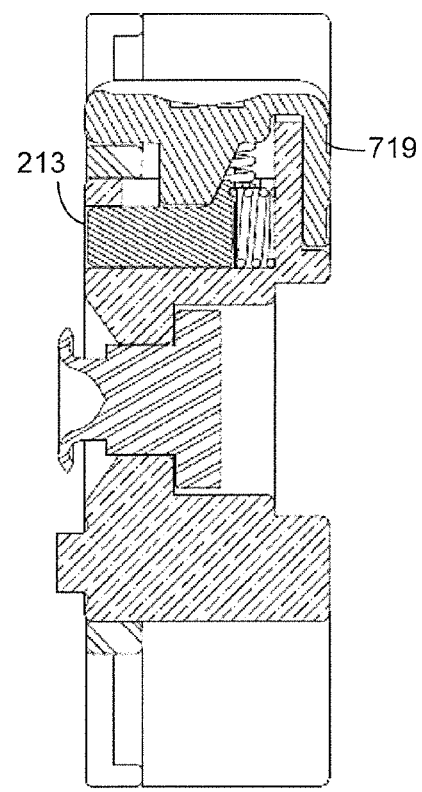

FIGS. 7A and 7B are cut away views of the housing assembly of FIG. 6, with a rivet 713 inserted into the central aperture of the body. FIGS. 7A and 7B serve to illustrate interaction of the button with the moveable pin.

FIG. 7A shows the button 121 in an undepressed position, with the button largely over the moveable pin 213 and biased away from the moveable pin by the spring 631 (and the second spring not visible in the cutaway view). In such a position, the spring 631 biases the moveable pin to extend from a face 711 of the body of the housing assembly. The descending fork includes an angled rear portion 721 complementary to the angled terminating plate of the moveable pin. Depression of the button, inward into the body of the housing assembly, causes the angled rear portion of the button to displace the angled terminating plate of the pin, and therefore the pin as a whole, rearwardly into the body of the housing assembly.

Figure 8:
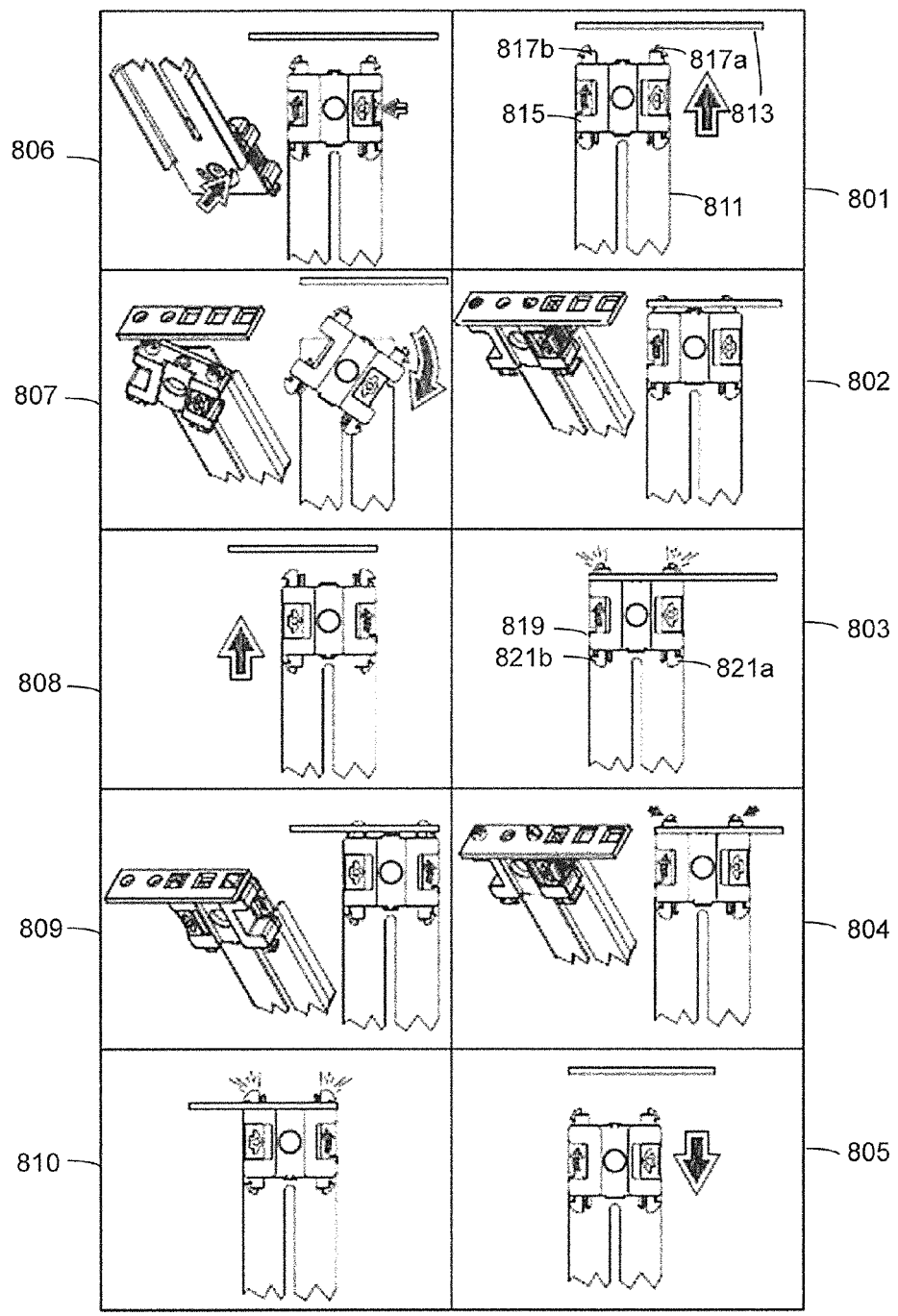
FIG. 8 illustrates an example of operation of a rotatable housing assembly in accordance with aspects of the invention.

FIG. 8 illustrates an example of operation of a rotatable housing assembly in accordance with aspects of the invention. Pane 801 shows a rotatable housing assembly 815 coupled to a bracket 811, and a plate 813 of a rack. The rotatable housing assembly includes a body 819 (labeled in pane 803 for clarity), first projections 817*a,b* extending on one side of the body, and projections 821*a,b* (labeled in pane 803 for clarity) extending from another side of the body.

Pane 802 shows the first projections partially inserted into mounting points of the rack. The mounting points being used are holes having a round outline. In some embodiments, for example using the rotatable housing assembly of FIG. 6, the first projections are normally biased vertically such that distance between barbs of the projections exceeds distance between edges of the round mounting holes. As the projections are inserted into the round mounting holes, the barbs are deflected by contact edges of the round mounting holes such that the barbs may pass through the round mounting holes. Upon full insertion of the first projections into the round mounting holes, however, the barbs of the first projections are normally biased to wrap around edges of the round mounting holes, as may be seen in pane 803. In some embodiments the biasing force is sufficient to have the projections audibly snap into position, providing auditory confirmation of appropriate mounting of the housing assembly.

Pane 804 shows force to the first projections, roughly in the plane of the plate of the rack. The force counteracts the force normally biasing the barbs, and deflects the barbs such that the barbs may pass through the round mounting holes. A user may apply the force using his fingers, for example. Pane 805 shows the projections retracted from the rack.

Pane 806 shows depression of a button of the housing assembly into the housing. Depression of the button causes retraction of a pin of the housing assembly into the body, to an extent to clear the bracket. As can be seen in pane 806, the housing assembly includes another pin, with both the pin (at least prior to retraction) and the other pin positioned in a slot with a semi-circular outline. Pane 807 shows the housing assembly being rotated with respect to the bracket. Although not visible in pane 807, the other pin moves in the slot during rotation of the housing assembly, while the retracted pin, being clear of the bracket, may slide over or past the bracket. Pane 808 shows the housing assembly rotated into a position such that the second protrusions are in the position previously occupied by the first protrusions, and configured for mounting to the rack. In this position, the other pin has reached an end of the slot previously occupied by the retracted pin, and the retracted pin has reached an end of the slot previously occupied by the other pin. In such a position, the retracted pin is biased into the slot, and the position of both pins indexes the housing assembly into proper position and prevents rotation of the housing assembly. Pane 809 shows the second protrusions being inserted into square mounting holes of the rack, similar to pane 804, and pane 810 shows full intrusion of the second protrusions into the square mounting holes of the rack, similar to pane 805. Thus, considering that the deflection of the barbs of the first projections, the rotation of the housing assembly, and the reinsertion and retention in the rack of the barbs of the second projections may be accomplished without tools in some embodiments, the housing assembly provides for toolless installation and removal of rack mounted slides.

Figure 9:
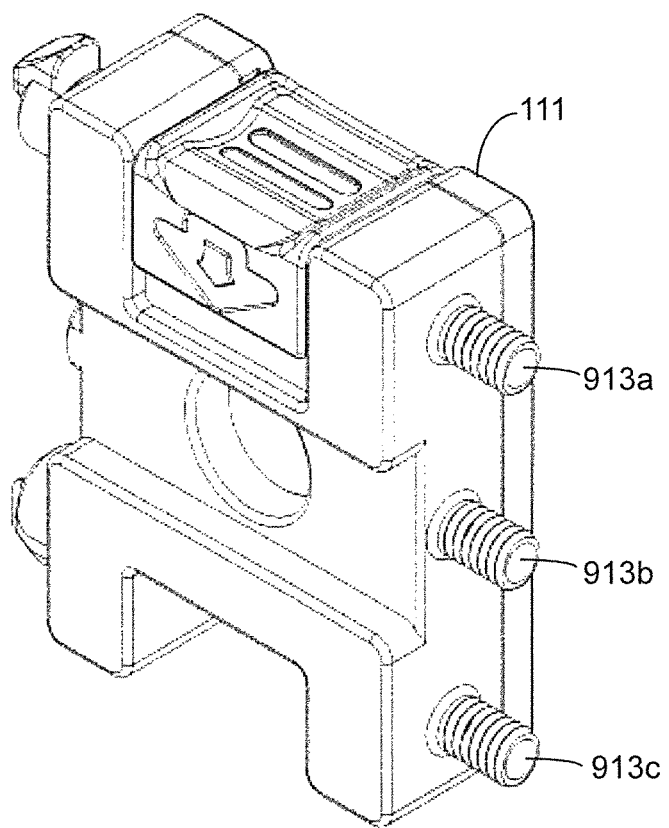
FIG. 9 shows a further housing assembly in accordance with aspects of the invention

FIG. 9 shows a further housing assembly in accordance with aspects of the invention. The housing assembly 911 of FIG. 9 includes posts 913a,b,c instead of, for example, the second protrusions of the embodiment of FIG. 1. As illustrated in FIG. 9, the posts are threaded so as to receive a nut or other female threaded object. In addition, the embodiment of FIG. 9 includes a three posts, although different numbers of posts could be used if desired. The posts are integrally formed with a body of the housing assembly in some embodiments, while in other embodiments the posts are separately formed and fixed in cavities of the body.

Figure 10:
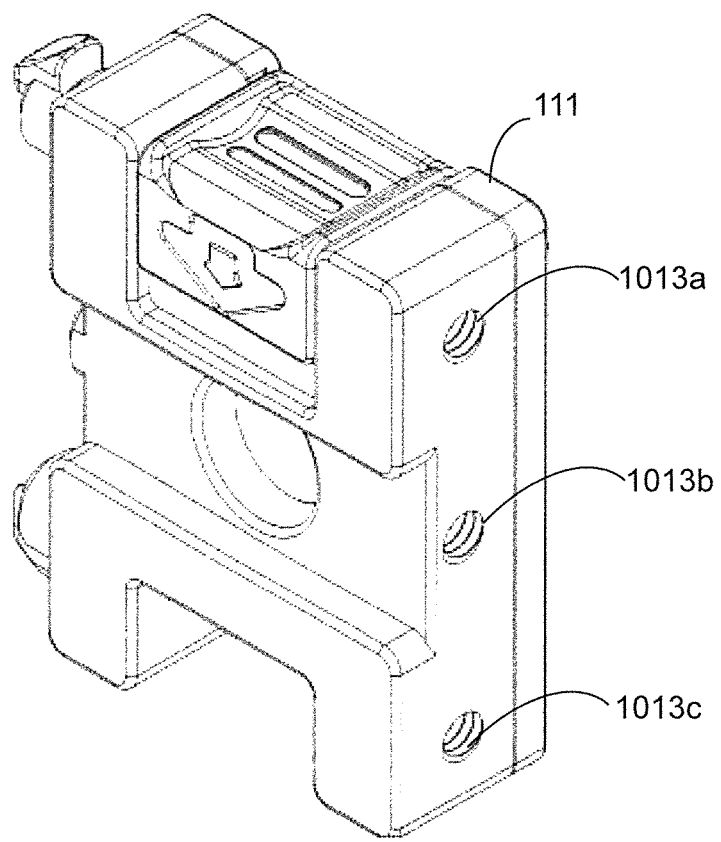
FIG. 10 shows a still further embodiment of a housing assembly in accordance with aspects of the invention.

Similarly, FIG. 10 shows a still further embodiment of a housing assembly 1011 in accordance with aspects of the invention. The housing assembly of FIG. 10 includes cavities 1013 a,b,c in place of the second protrusions. As illustrated in FIG. 10, the cavities are threaded to receive a bolt or screw or the like.

Aspects of the invention therefore provide a housing assembly. Although the invention has been discussed with respect to various embodiments, it should be recognized that the invention comprises the novel and non-obvious claims supported by this disclosure.

What is claimed is:

1. A slide assembly for use in rack mounted applications, comprising:
   a first slide member;
   a second slide member extendably coupled to the first slide member; and
   a housing rotatably coupled to the first slide member, the housing having protrusions extending from opposing sidewalls of the housing, a retractable pin normally biased by a spring to extend from the housing, the retractable pin engageable with a feature associated with the first slide member; and
   a button configured to cause retraction of the retractable pin when depressed.

2. The slide assembly of claim 1, wherein the feature is a slot.

3. The slide assembly of claim 2 wherein the slot defines a semicircular portion of a ring.

4. The slide assembly of claim 1, wherein the feature is an aperture.

5. The slide assembly of claim 1, further comprising a bracket attached to the first slide member, and wherein the housing is rotatably coupled to the first slide member by being rotatably coupled to the bracket.

6. The slide assembly of claim 5 wherein the feature is a slot in the bracket.

7. The slide assembly of claim 6 wherein the slot defines a semicircular portion of a ring.

8. The slide assembly of claim 5 wherein the feature is an aperture in the bracket.

9. The slide assembly of claim 1, wherein the first slide member comprises a longitudinal web bounded by raceways, and the retractable pin extends from the housing in a direction towards a plane defined by the longitudinal web of the first slide member.

10. The slide assembly of claim 1, wherein the protrusions are configured to mate with mounting points of a computer equipment rack.

11. The slide assembly of claim 1, wherein the housing has a further pin extending from the housing in a same direction as the retractable pin.

12. The slide assembly of claim 11, wherein the further pin is engageable with the feature associated with the first slide member.

13. A housing assembly for mounting a slide to a rack for computer equipment, comprising:
   a body, the body having an aperture for use in rotatably mounting the housing assembly;
   protrusions for a first mounting configuration extending from the body in a direction orthogonal to an axis of the aperture;
   protrusions for a second mounting configuration extending from the body in a direction other than a direction of extension of the protrusion for the first mounting configuration; and
   a retractable pin extending from the body in a direction parallel to the axis of the aperture;
   wherein each of the protrusions comprises a wall extending from the body and forming a portion of a surface of each protrusion;
   wherein each of the protrusions further comprises an attachment forming a body of each protrusion, the attachment disposed in a slot in the body having an aperture for use in rotatably mounting the housing assembly.

14. The housing assembly of claim 13, wherein the attachments comprise a barb disposed near a distal end of the attachments and extending away from the wall.

15. The housing assembly of claim 13, further comprising a spring to bias the attachment of at least one of the protrusions away from the wall of the at least one of the protrusions.

16. A housing assembly for mounting a slide to a rack for computer equipment, comprising:
   a body, the body having an aperture for use in rotatably mounting the housing assembly;
   protrusions for a first mounting configuration extending from the body in a direction orthogonal to an axis of the aperture;
   protrusions for a second mounting configuration extending from the body in a direction other than a direction of extension of the protrusion for the first mounting configuration; and
   a retractable pin extending from the body in a direction parallel to the axis of the aperture;
   further comprising a depressible button configured to cause retraction of the retractable pin when depressed.

17. The housing assembly of claim 16, further comprising a spring configured to bias the retractable pin outward from the body, and
   wherein the retractable pin comprises an angled terminating plate, and
   the depressible button comprises a fork and configured to engage the retractable pin and thereby move the retractable pin inward when the depressible button is depressed.

18. A mounting assembly for mounting a slide to a rack for computer equipment, comprising:
   a bracket for coupling to a slide member;
   a housing assembly rotatably coupled to the bracket comprising:
   a body having a generally parallelepiped shape;
   an aperture extending between first and second surfaces of the body, the housing assembly rotatably mounted to the bracket at the aperture;
   protrusions for a first mounting configuration disposed on a third surface of the body;
   protrusions for a second mounting configuration disposed on a fourth surface of the body, the fourth surface opposite the third surface; and
   a retractable pin extending from the first surface toward the bracket;

wherein each of the protrusions comprises a wall extending from the body and forming part of a surface of the protrusion; and wherein each of the protrusions further comprises an attachment forming a body of the protrusion, the attachment disposed in a slot in the body having a generally parallelepiped shape.

19. The mounting assembly of claim 18, wherein the bracket includes a first aperture to engage the retractable pin when the housing assembly is rotated for use in the first mounting configuration and a second aperture to engage the retractable pin when the housing assembly is rotated for use in the second mounting configuration.

20. The mounting assembly of claim 18, wherein the protrusions for the first mounting configuration have a circular cross-section and the protrusions for the second mounting configuration have a parallelogrammatic cross-section.

21. A mounting assembly for mounting a slide to a rack for computer equipment, comprising:
   a bracket for coupling to a slide member;
   a housing assembly rotatably coupled to the bracket comprising:
   a body having a generally parallelepiped shape;
   an aperture extending between first and second surfaces of the body, the housing assembly rotatably mounted to the bracket at the aperture;
   protrusions for a first mounting configuration disposed on a third surface of the body;
   protrusions for a second mounting configuration disposed on a fourth surface of the body, the fourth surface opposite the third surface; and
   a retractable pin extending from the first surface toward the bracket;
   wherein the housing assembly further comprises a second pin extending from the first surface and situated opposite the retractable pin from the aperture, and
   wherein the bracket includes an approximately semicircular slot to engage the retractable pin and the second pin, the semicircular slot arranged so that the retractable pin is approximate a first end of the semicircular slot and the second pin is approximate a second end of the semicircular slot when the housing assembly is rotated for use in the first mounting configuration and the retractable pin is approximate the second end of the semicircular slot and the second pin is approximate the first end of the semicircular slot when the housing assembly is rotated for use in the second mounting configuration.

22. A mounting assembly for mounting a slide to a rack for computer equipment, comprising:
   a bracket for coupling to a slide member;
   a housing assembly rotatably coupled to the bracket comprising:
   a body having a generally parallelepiped shape;
   an aperture extending between first and second surfaces of the body, the housing assembly rotatably mounted to the bracket at the aperture;
   protrusions for a first mounting configuration disposed on a third surface of the body;
   protrusions for a second mounting configuration disposed on a fourth surface of the body, the fourth surface opposite the third surface; and
   a retractable pin extending from the first surface toward the bracket;
   wherein the housing assembly further comprises a depressible button configured to cause retraction of the retractable pin when depressed.

23. The mounting assembly of claim 22, wherein the housing assembly is rotatable when the retractable pin is retracted and fixed in one of plurality of positions when the retractable pin is extended.

24. The housing assembly of claim 22, wherein the depressible button is disposed on a fifth surface of the body.

25. The housing assembly of claim 22, wherein the housing assembly further comprises a spring configured to bias the retractable pin outward from the body, and
   wherein the retractable pin comprises an angled terminating plate, and
   the depressible button comprises a fork and configured to engage the retractable pin and thereby move the retractable pin inward when the depressible button is depressed.

* * * * *